(12) United States Patent
Ruelke et al.

(10) Patent No.: US 8,772,178 B2
(45) Date of Patent: Jul. 8, 2014

(54) TECHNIQUE FOR FORMING A DIELECTRIC INTERLAYER ABOVE A STRUCTURE INCLUDING CLOSELY SPACED LINES

(75) Inventors: Hartmut Ruelke, Dresden (DE); Christof Streck, Coswig (DE); Kai Frohberg, Meissen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1645 days.

(21) Appl. No.: 11/082,156

(22) Filed: Mar. 16, 2005

(65) Prior Publication Data
US 2006/0001168 A1    Jan. 5, 2006

(30) Foreign Application Priority Data
Jun. 30, 2004    (DE) .......................... 10 2004 031 744

(51) Int. Cl.
*H01L 21/469*    (2006.01)

(52) U.S. Cl.
USPC ........... 438/778; 438/680; 438/761; 438/763; 257/E21.576

(58) Field of Classification Search
USPC ......... 438/787, 624, 633, 676, 680, 681, 758, 438/759, 761, 763, 778, 788, 791; 257/760, 257/773, 632, 635, 637, 640, 649, 701, 257/E21.576
See application file for complete search history.

(56) References Cited

U.S. PATENT DOCUMENTS

| | | | | |
|---|---|---|---|---|
| 5,271,972 A | * | 12/1993 | Kwok et al. | 427/579 |
| 5,563,105 A | * | 10/1996 | Dobuzinsky et al. | 438/784 |
| 5,681,425 A | | 10/1997 | Chen | 156/643.1 |
| 5,702,980 A | * | 12/1997 | Yu et al. | 438/623 |
| 5,795,833 A | * | 8/1998 | Yu et al. | 438/763 |
| 5,807,785 A | * | 9/1998 | Ravi | 438/624 |
| 5,858,870 A | | 1/1999 | Zheng et al. | 438/622 |
| 5,874,328 A | * | 2/1999 | Liu et al. | 438/199 |
| 6,034,395 A | | 3/2000 | Tripsas et al. | 257/316 |
| 6,066,577 A | * | 5/2000 | Cooney et al. | 438/787 |
| 6,245,666 B1 | * | 6/2001 | Ko et al. | 438/623 |
| 6,716,698 B1 | | 4/2004 | He et al. | 438/257 |
| 6,849,504 B2 | * | 2/2005 | Chang et al. | 438/261 |

OTHER PUBLICATIONS

Wolf et al., Silicon Processing for the VLSI Era, vol. 1: Process Technology, 2nd Ed. Lattice Press: Sunset Beach, CA, 2000, pp. 795-797.*

Translation of Official Communication from German Patent Office for German Patent Application No. 10 2004 031 744.5 dated Jul. 12, 2010.

* cited by examiner

*Primary Examiner* — Colleen Matthews
*Assistant Examiner* — Colleen E Snow
(74) *Attorney, Agent, or Firm* — Amerson Law Firm, PLLC

(57) ABSTRACT

By depositing the lower portion of a silicon dioxide interlayer dielectric by means of SACVD or HDP-CVD techniques, the generation of voids may be reliably avoided even for devices having spaces between closely spaced lines on the order of 200 nm or less. Moreover, the bulk silicon dioxide material is deposited by well-established plasma enhanced CVD techniques, thereby providing the potential for using well-established process recipes for the subsequent CMP process, so that production yield and cost of ownership may be maintained at a low level.

29 Claims, 2 Drawing Sheets

TECHNIQUE FOR FORMING A DIELECTRIC INTERLAYER ABOVE A STRUCTURE INCLUDING CLOSELY SPACED LINES

BACKGROUND OF THE INVENTION

1. Field of the Invention

Generally, the present invention relates to the formation of integrated circuits, and, more particularly, to the formation of a dielectric interlayer between and over circuit elements including closely spaced lines, such as gate electrodes, polysilicon interconnect lines and the like.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, MOS technology based on silicon is currently the most promising approach due to the superior characteristics in view of operating speed and/or power consumption and cost effectiveness. During the fabrication of complex integrated circuits using MOS technology, millions of transistors, i.e., N-channel transistors and/or P-channel transistors, are formed on a substrate including a crystalline silicon layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors, resistors and the like, are formed in a common layer, which will be referred to hereinafter as a device layer, whereas the "wiring," i.e., the electrical connection of circuit elements according to the circuit design, may be accomplished only to a certain degree by means of polysilicon lines and the like within the device layer so that one or more additional "wiring" layers formed over the device layer may be required. These wiring layers include metal lines embedded into an appropriate dielectric material, such as silicon dioxide, silicon nitride and the like, or, in very advanced devices, low-k materials having a permittivity of 3.5 or less are used. The metal lines and the surrounding dielectric material will be referred to hereinafter as a metallization layer. Between two adjacent metallization layers and also between the device layer and the first metallization layer, respective dielectric interlayers are formed through which metal-filled openings are formed to establish the electrical connection between metal lines or between circuit elements and metal lines. In typical applications, the dielectric interlayer separating the device layer from the first metallization layer is essentially formed from silicon dioxide that is deposited by well-established plasma enhanced chemical vapor deposition (PECVD) techniques, which enable the formation of a smooth and dense silicon dioxide film with sufficient conformality at moderately high deposition rates. Upon further device scaling, resulting in gate lengths of MOS transistors on the order of 50 nm or even less, the distances between neighboring circuit elements, such as polysilicon lines, gate electrodes and the like are also reduced and have now reached 200 nm and less in modern CPUs. It turns out, however, that the gap-fill capabilities of well-established high rate PECVD techniques for the deposition of silicon dioxide may no longer suffice to reliably form a dielectric interlayer, as will be described in more detail with reference to FIGS. 1a-1c.

In FIG. 1a, a semiconductor device 100 comprises a substrate 101 that may be a bulk silicon substrate or a silicon-on-insulator (SOI) substrate having formed thereon a device layer 102 including, for instance, a silicon layer 110 having formed thereon a structure 103 that may comprise closely spaced lines 104. Hence, the device layer 102 may represent a substantially crystalline silicon region in which and on which circuit elements, such as field effect transistors, capacitors and the like, are formed. The structure 103 may represent an area having a plurality of dense polysilicon lines, or the lines 104 may represent portions of gate electrodes of transistor elements. The lines 104 may have formed on sidewalls thereof corresponding spacer elements 105, as are typically used for forming gate electrode structures. An etch stop layer 109, typically comprised of silicon nitride, is formed over the device layer 102 to cover the layer 110 and the line structure 103. A silicon dioxide layer 107 is formed above the etch stop layer 109 to completely enclose the line structure 103.

A typical conventional process flow for forming the device 100 as shown in FIG. 1a may include the following processes. After fabrication processes to form circuit elements, such as transistors, capacitors and the line structure 104, which include lithography, deposition, etch, implantation and other techniques, the etch stop layer 109 is formed, typically by plasma enhanced chemical vapor deposition (PECVD), since PECVD of silicon nitride may be accomplished at moderately low temperatures of less than approximately 600° C., which is compatible with preceding manufacturing processes and materials, such as metal silicides and the like. As previously discussed, the ongoing shrinkage of feature sizes also entails that a distance between neighboring circuit elements, such as a distance 111 between the closely spaces lines 104, is reduced and may be less than approximately 200 nm in currently manufactured CPUs of the 90 nm technology node. Hence, any deposition techniques for forming a dielectric layer for embedding the line structure 103 with open spaces therebetween have to meet the requirements of an appropriate fill capability to reliably and completely fill the empty spaces between the densely spaced lines 104. By means of well-established PECVD process recipes for silicon nitride, the layer 109 may be deposited in a more or less conformal fashion with a thickness in the range of approximately 10-80 nm. Thereafter, the silicon dioxide layer 107 is deposited, which is typically done by PECVD on the basis of precursors TEOS (tetra-ethyl-ortho-silicate) and oxygen, since PECVD, contrary to thermal TEOS CVD, allows the deposition of silicon dioxide in a moderately conformal manner, yet with significantly less gap filling qualities compared to thermal CVD, with relatively high mechanical stability at temperatures below 600° C. at high deposition rates, which provides a high production yield. Moreover, PECVD cluster tools are readily available so that the deposition of the silicon nitride layer 109 and the PECVD silicon dioxide layer 107 may be performed in a highly efficient manner.

However, when the distance 111 approaches approximately 200 nm, it turns out that the fill capabilities of well-established PECVD techniques for depositing silicon dioxide on the basis of TEOS and oxygen may not be adequate to completely fill the empty spaces between the lines 104, thereby creating voids 106, which may lead to reliability concerns during the further processing of the semiconductor device 100. Moreover, it should be noted that the silicon dioxide layer 107 has a certain topography caused by the underlying structure of the device layer 102, for instance, by the line structure 103, which may jeopardize subsequent manufacturing processes, such as a photolithography step for forming contact openings to underlying portions of circuit elements located in the layer 110 or on the lines 104. Consequently, standard process flow requires that the silicon dioxide layer 107 be planarized, typically by chemical mechanical polishing (CMP), wherein excess material of the silicon dioxide layer 107 is removed by chemical and mechanical interaction with a slurry and a polishing pad to finally obtain a substantially planarized surface of the silicon dioxide layer 107. The CMP process itself is a highly complex process and requires sophisticated process recipes, which significantly depend on the characteristics of the silicon dioxide layer 107, such as density, mechanical stress, water contents and the like. Hence, a great deal of effort has been made to develop corresponding process recipes for reliable and reproducible CMP processes for PECVD TEOS silicon dioxide, as this material is frequently used for a dielectric interlayer in silicon-based semiconductor devices and even in devices formed from other semiconductors.

FIG. 1b schematically shows the semiconductor device 100 after the planarization of the silicon dioxide layer 107 by well-established CMP recipes to form a substantially planarized silicon dioxide layer 107a. Moreover, an anti-reflective coating (ARC) layer 108 is formed on the silicon dioxide layer 107a, wherein the characteristics of the ARC layer 108 are designed for a subsequent photolithography process for patterning a resist layer to etch respective contact openings to the device layer 102. The ARC layer 108 may be comprised of silicon oxynitride, wherein typically the oxygen/nitrogen ratio is correspondingly adapted to obtain a specified index of refraction and extinction coefficient in order to achieve, in combination with a specified layer thickness, a minimum back reflection of the exposure radiation used in the subsequent photolithography. Typically, the ARC layer 108 is formed by PECVD, wherein the oxygen/nitrogen ratio may be adjusted by controlling the supply of corresponding precursor gases.

During the CMP process for forming the planarized layer 107a and the subsequent photolithography followed by anisotropic etch techniques, the voids 106 created during the deposition of the silicon dioxide layer 107 may result in significant process variations and increased defect rates, especially during the anisotropic etch processes, so that the above-described well-established process flow may no longer be adequate for devices having distances between neighboring lines of approximately 200 nm or less, which are typically encountered in semiconductor products of the 90 nm technology node.

FIG. 1c schematically shows the semiconductor device 100 according to a further conventional approach. The semiconductor device 100 of FIG. 1c substantially corresponds to the device 100 shown in FIG. 1a, with the exception that the dielectric layer formed on the silicon nitride layer 109 is deposited by a different deposition technique having a significantly enhanced gap filling capability to avoid the creation of the voids 106 (FIG. 1a). Hence, in FIG. 1c, a silicon dioxide layer 117 is provided that may be formed by a thermal CVD process on the basis of TEOS and ozone, which generates a silicon dioxide film exhibiting excellent gap filling capabilities, that is, this deposition technique provides excellent conformality, and may even display a "flow-like" behavior, thereby allowing reliable filling of the empty spaces between the lines 104. In view of the film characteristics, the thermal CVD process is typically performed at significantly higher pressures compared to the plasma enhanced deposition technique, for example in the range of 200-760 Torrs, and is therefore denoted as "sub-atmospheric CVD" (SACVD). Another deposition technique for silicon dioxide is the plasma enhanced deposition in which a high-density plasma is used, thereby also achieving excellent conformality and gap-filling capabilities. After the formation of the silicon dioxide layer 117 in accordance with one of these two deposition techniques, further processing may be continued as is described with reference to FIG. 1b. That is, the silicon dioxide layer 117 is planarized by CMP and subsequently an ARC layer may be deposited for the subsequent photolithography. Despite the superior gap filling capabilities of the SACVD and the high density plasma (HDP) CVD, it turns out that the very different film characteristics of the silicon dioxide layer 117 compared to the plasma enhanced CVD film 107 require completely new CMP and substrate handling strategies and may also bring about a significant reduction in production yield due to reduced deposition rates, particularly when the SACVD technique is employed.

For example, the silicon dioxide layer 117 is less dense than the layer 107 and also readily absorbs water, which leads to an alteration of the intrinsic stress in the layer 117. Typically, the SACVD TEOS silicon dioxide exhibits a moderate tensile stress immediately after deposition, which may decrease and turn into compressive stress with the increasing absorption of water from the ambient atmosphere. Upon removal of the absorbed water, for example, by heating the substrate, again tensile stress is created in excess of the initially tensile stress, which is finally again achieved upon cooling the substrate. Thus, upon contact with air or water, the SACVD TEOS silicon dioxide layer 117 undergoes a stress hysteresis, which may be inadequate for sophisticated semiconductor devices, as stress and strain engineering becomes more and more important for extremely scaled devices. Due to the different mechanical characteristics of the layer 117 and the fact that intense contact with water during the CMP process may occur, great efforts have to be made to establish new CMP recipes. In combination with a reduced deposition rate, compared to the plasma enhanced CVD TEOS silicon dioxide, the process for forming the dielectric interlayer, that is a layer stack comprising the silicon nitride layer 109, the silicon dioxide layer 117 and the ARC layer 108 is cost-intensive and may bring about further issues related to the different film characteristics of the silicon dioxide layer 117 with respect to CMP, substrate handling, strain engineering and the like.

In view of the problems identified above, there exists a need for a cost-efficient technique for forming a dielectric interlayer for the first metallization layer, especially for devices having empty spaces between densely formed lines with approximately 200 nm or less.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a dielectric interlayer above the device layer on the basis of silicon dioxide, wherein, in illustrative embodiments, the upper portion of the silicon dioxide is formed by well-established plasma enhanced CVD techniques on the basis of TEOS, while a lower portion of the silicon dioxide is formed by a deposition technique that provides superior fill capabilities. Due to the deposition of silicon dioxide with superior gap fill characteristics, the initial aspect ratio of even extremely scaled devices having open spaces between closely spaced lines of approximately 200 nm or less may effectively be decreased so that the plasma enhanced CVD deposition techniques on the basis of TEOS, which are well-established for devices having critical dimensions in densely spaced line structures of 200 nm and above, may further be used, thereby providing significant advantages in view of defect rate, strain engineering, cost of ownership and the like compared to conventional approaches.

According to a further illustrative embodiment of the present invention, a method comprises forming a first layer comprising a first dielectric material over a structure having lines and spaces, wherein the first dielectric layer conformally covers the structure. Moreover, a second layer comprising a second dielectric material is formed above the first dielectric layer, wherein the second layer only partially fills the spaces. Finally, a third layer comprising the second dielectric material is formed above the second layer by a plasma enhanced chemical vapor deposition technique to enclose the structure.

In accordance with yet another illustrative embodiment of the present invention, a method of forming a dielectric interlayer between a device layer including closely spaced lines and a first metallization layer is provided. The method comprises depositing a first layer of silicon dioxide over the device layer by one of a thermal CVD process based on TEOS and a high density plasma CVD process. Then, a second layer of silicon dioxide is deposited on the first layer by a PECVD process based on TEOS. Finally, the second layer is planarized by chemical mechanical polishing.

According to further illustrative embodiment, a method of forming a dielectric interlayer between a device layer including closely spaced lines and a first metallization layer is provided. The method comprises depositing a first layer of silicon dioxide over the device layer by one of a thermal CVD process based on TEOS and a high density plasma CVD process. An etch stop layer is then formed on the first layer and a second layer of silicon dioxide is deposited on the first layer by a PECVD process based on TEOS. Finally, the second layer is planarized by CMP.

According to still another embodiment of the present invention, a semiconductor device comprises a device layer including closely spaced conductive lines and a first metallization layer located above the device layer. The semiconductor device further comprises a dielectric interlayer disposed between the device layer and the first metallization layer, wherein the dielectric interlayer comprises a conformal etch stop layer, a first silicon dioxide layer formed on the etch stop layer, and a second silicon dioxide layer formed on the first silicon dioxide layer.

According to a further illustrative embodiment of the present invention, a semiconductor device comprises a device layer including closely spaced conductive lines and a first metallization layer located above the device layer. Moreover, the device comprises a dielectric interlayer disposed between the device layer and the first metallization layer, wherein the dielectric interlayer comprises a first silicon dioxide layer enclosing at least a bottom portion of the closely spaced lines, an etch stop layer formed above the first silicon dioxide layer and a second silicon dioxide layer formed above the etch stop layer.

BRIEF DESCRIPTION OF THE DRAWINGS

The invention may be understood by reference to the following description taken in conjunction with the accompanying drawings, in which like reference numerals identify like elements, and in which.

Figure 1A:
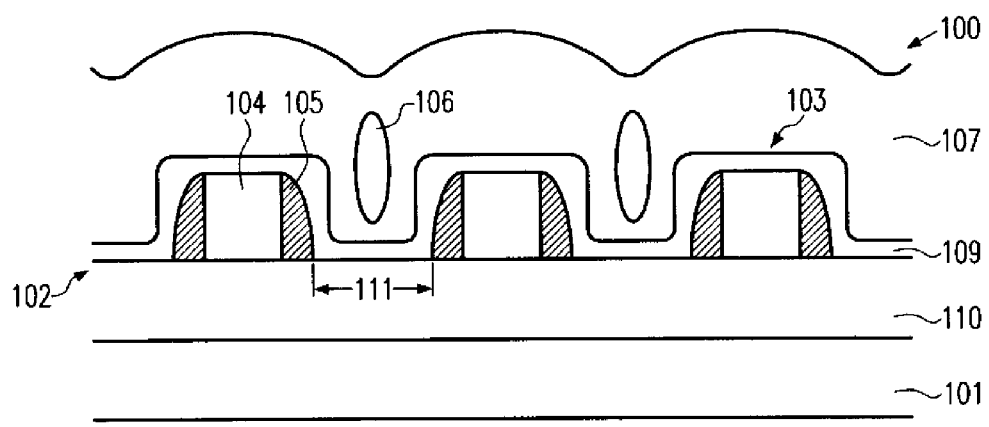
FIGS. 1a and 1b schematically show a semiconductor device including closely spaced lines during the formation of a dielectric interlayer for the first metallization layer in accordance with well-established conventional plasma enhanced CVD silicon dioxide deposition techniques on the basis of TEOS for devices of the 90 nm technology node.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
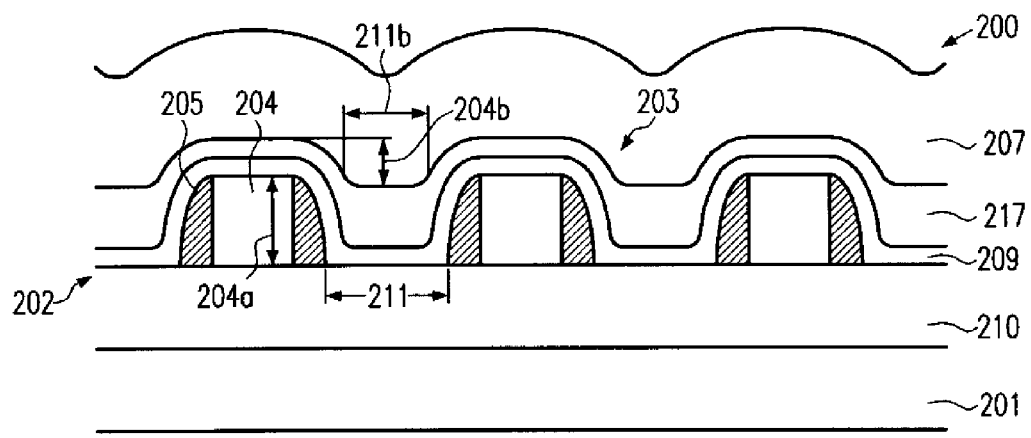
FIGS. 2a and 2b schematically show a semiconductor device during various manufacturing stages in forming a dielectric interlayer in accordance with illustrative embodiments of the present invention.
Figure 2B:
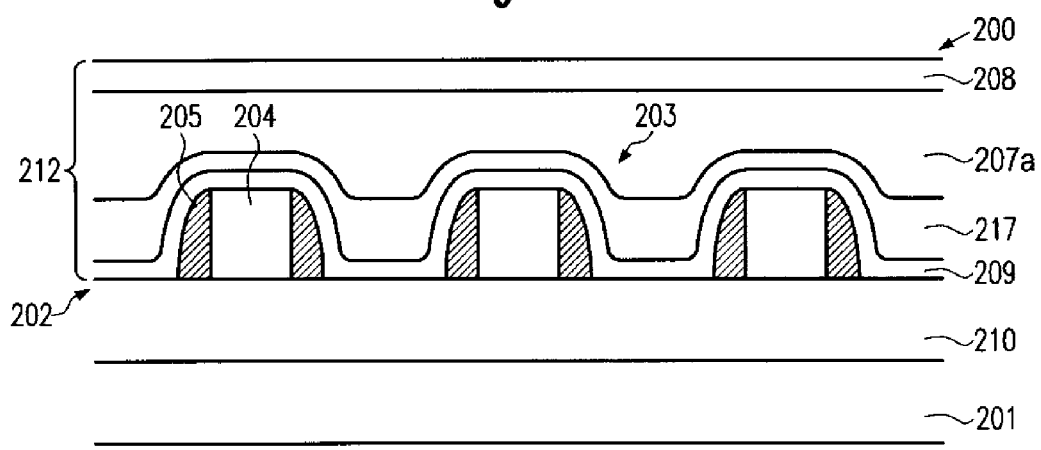
Figure 3:
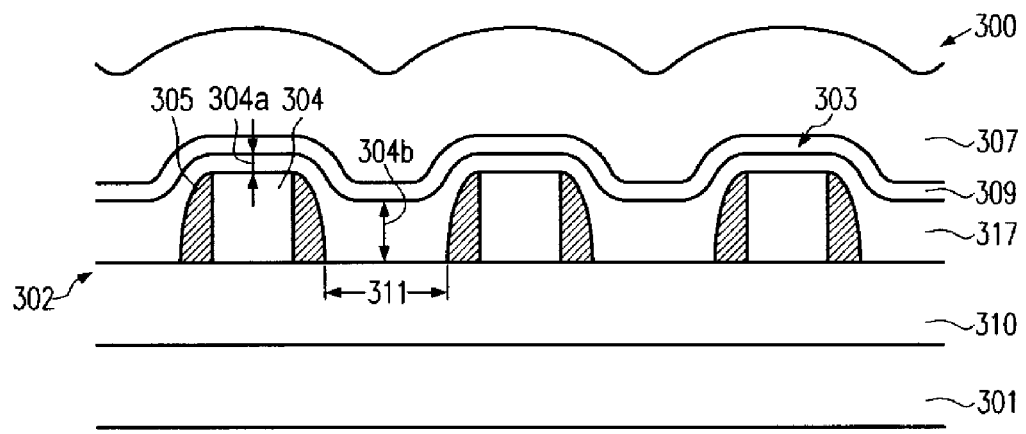
FIG. 3 schematically shows a semiconductor device during the formation of a dielectric interlayer, wherein a silicon dioxide bottom layer may be formed by a deposition technique with superior gap filling capabilities, which may be less sensitive to deposition rate degradation caused by silicon nitride.

The present invention is based on the concept that the aspect ratio of empty spaces between closely spaced lines may be efficiently reduced by filling at least a portion of the empty space by a deposition technique having superior gap fill capabilities so that well-established deposition techniques may be used to form the majority of the dielectric material. As is well known, SACVD of silicon dioxide on the basis of TEOS may provide a highly conformal deposition behavior, or even a flow-like deposition behavior, and thus enables leveling a line structure to a certain degree, thereby providing the potential for depositing the bulk material of the silicon dioxide over the pre-filled line structure by well-established plasma enhanced CVD techniques. Consequently, in the further manufacturing processes, the well-known characteristics of the plasma enhanced CVD TEOS silicon dioxide may allow the application of well-established process recipes, while the deposition of the bulk silicon dioxide by means of the high rate plasma enhanced deposition technique still provides a high throughput, thereby significantly reducing the cost of ownership compared to a complete deposition of the silicon dioxide by means of SACVD or HDP CVD. With reference to FIGS. 2a, 2b and 3, further illustrative embodiments of the present invention will now be described.

FIG. 2a schematically shows a cross-sectional view of a semiconductor device 200 comprising a substrate 201, which may be any appropriate semiconductor bulk substrate, such as a silicon substrate, or which may be an insulating substrate having formed thereon a crystalline silicon layer. In particular, the substrate 201 may represent an SOI substrate, as sophisticated integrated circuits are increasingly produced as silicon-based SOI devices. The substrate 201 comprises a device layer 202, which may include a substantially crystalline semiconductor layer 210 in and on which circuit elements such as transistors, capacitors and the like are formed. The device layer 202 further comprises a structure 203 formed above the semiconductor layer 210, which includes closely spaced lines 204 having a minimum distance 211 that is substantially determined by the specified technology node and of course by a certain degree of process fluctuation. In particular embodiments, the distance 211 is approximately 200 nm or less. In other embodiments, the distance 211 is approximately 180 nm or less. It should be noted that the term "closely spaced lines" is to include any neighboring portions of circuit elements, such as portions of gate electrodes, portions of polysilicon lines and the like, wherein at least one empty space between two adjacent lines or line portions is described by the distance 211. In FIG. 2a, the lines 204 are shown to have formed on sidewalls thereof spacer elements 205, since typically polysilicon lines or gate electrodes are formed with respective sidewall spacers. The spacers 205 may be substantially comprised of silicon nitride. However, in other embodiments, the lines 204 may be provided without the spacers 205 or the spacers 205 may be formed of other dielectric materials such as silicon dioxide. The device 200 further comprises a first dielectric layer, which is also referred to as an etch stop layer 209, that is, in one particular embodiment, provided as a highly conformal layer with a thickness required to reliably stop an anisotropic etch process for forming contact openings to the lines 204 and other device portions formed on the layer 210. In one embodiment, the etch stop layer 209 may be comprised of silicon nitride, which exhibits an excellent etch selectivity to silicon dioxide. In other embodiments, the etch stop layer 209 may comprise other dielectric materials, such as silicon carbide or nitrogen enriched silicon carbide. Formed above the etch stop layer 209 is a second dielectric layer 217, which is comprised of silicon dioxide in one particular embodiment, wherein the layer 217 may have specified film characteristics as are substantially defined by the deposition technique used for forming the layer 217. In particular, the layer 217 is formed more in a flow-like fashion rather than in a highly conformal fashion, thereby significantly reducing the aspect ratio of the empty spaces between the lines 204. A third dielectric layer 207 is formed above the second layer 217 and is comprised of substantially the same material, such as silicon dioxide, wherein the film characteristics of the layer 207 differ from those of the layer 217 due to a different deposition technique used during the formation of the layer 207. Moreover, the layer 207 is provided with a thickness that is sufficient to completely enclose the structure 203 and also to provide sufficient excess material for a subsequent planarization.

A typical process flow for forming the semiconductor device 200 as shown in FIG. 2a may comprise the following process. After the formation of circuit elements and the structure 203 in accordance with specified design rules, which also define the magnitude of the distance 211, and in accordance with well-established process techniques involving photolithography, deposition, etch, implantation and other techniques, the highly conformal etch stop layer 209 is formed, for instance by plasma enhanced chemical vapor deposition, on the basis of silane and ammonia or pure nitrogen at temperatures well below of 600° C., when the etch stop layer 209 is provided in the form of a silicon nitride layer.

Corresponding process recipes are well established in the art. In some embodiments, when the etch stop layer 209 is provided in the form of silicon nitride, the thickness thereof is adjusted to obtain a highly conformal layer and may be in the range of approximately 5-35 nm, or, in other embodiments, from approximately 10-80 nm. Moreover, as previously mentioned, stress and strain engineering in sophisticated semiconductor devices is rapidly gaining importance as, for instance, the channel conductivity of transistor elements may effectively be modified by creating strain in the channel regions of the transistors. Therefore, by adjusting the stress in the etch stop layer 209 to a specified value, a corresponding strain in the lines 204 and regions below the lines 204 may be achieved, thereby adjusting the charge carrier mobility to a desired value. As is well known, the stress characteristics of silicon nitride may be adjusted from large tensile values to large compressive values by appropriately selecting the gas mixture, the deposition rate, the temperature and, in particular, the ion bombardment during the deposition. Ion bombardment may be readily adjusted by using dual frequency reactors in which the biasing power may then be adjusted to achieve the desired magnitude of tensile or compressive stress.

Thereafter, the silicon dioxide layer 217 may be deposited by a highly gap filling deposition technique, such as SACVD of silicon dioxide on the basis of TEOS and ozone, or by high density plasma CVD on the basis of silane or TEOS and oxygen and argon. While HDP-CVD silicon dioxide exhibits excellent gap filling characteristics and a high density, it usually has high compressive stress, which may, in some cases, be inappropriate in view of a desired stress engineering. SACVD silicon dioxide exhibits a flow-like film characteristic, has a significantly lower density compared to plasma enhanced CVD TEOS silicon dioxide, but exhibits significantly less intrinsic stress, especially when the absorption of water is reduced or prevented.

Irrespective of the deposition technique used, due to the superior gap fill capabilities compared to the plasma enhanced CVD process, the ability to fill the empty spaces is increased. Initially, the aspect ratio of the empty spaces is defined by the distance 211 and a height 204a of the lines 204. After the deposition of the layer 217, the aspect ratio of the remaining space is effectively reduced. The reduced aspect ratio corresponds to a distance 211b and a height 204b and relaxes the constraints for a subsequent deposition step. Consequently, the majority of the dielectric material required for the encapsulation of the structure 203 may be deposited by well-established plasma enhanced CVD techniques without risking the creation of voids. Therefore, in one particular embodiment, the layer 207 is provided as a silicon dioxide layer and is deposited by plasma enhanced CVD on the basis of TEOS with conventional process recipes to obtain a thickness that allows the planarization of the layer 207 without exposing portions of the layer 217. As is well known, plasma enhanced CVD of silicon dioxide on the basis of TEOS allows a high deposition rate, in particular in comparison to the SACVD process, thereby maintaining a high throughput.

In one particular embodiment, the deposition of the layer 217 and 207 may be performed in a clustered CVD system, for instance containing an SACVD and a plasma enhanced CVD reactor, whereby high throughput at reduced cost of ownership may be achieved while additionally the risk of water absorption into the layer 217 is significantly reduced, thereby also providing stable stress conditions within the layer 217. Appropriate cluster CVD systems may include, for instance, the Producer™ system available from Applied Materials Inc. In other embodiments, the clustered system may also comprise a reaction chamber for forming the etch stop layer 209, or the same PECVD reactor may be used for the formation of the etch stop layer 209 and the silicon dioxide layer 207.

In another embodiment, an intermediate layer may be formed between the silicon dioxide layers 217 and 207, for instance when more pronounced moisture preventing characteristics are desired as may be achieved with the layer 207. For instance, an additional silicon nitride layer may be formed on the layer 217 to efficiently passivate the layer 217 in view of water absorption and stress stability. In this case, a subsequent etch process for forming contact openings through the layers 207, 217, 209 has to be adapted to the additional silicon nitride layer, which may act as a further etch stop layer.

Figure 1B:
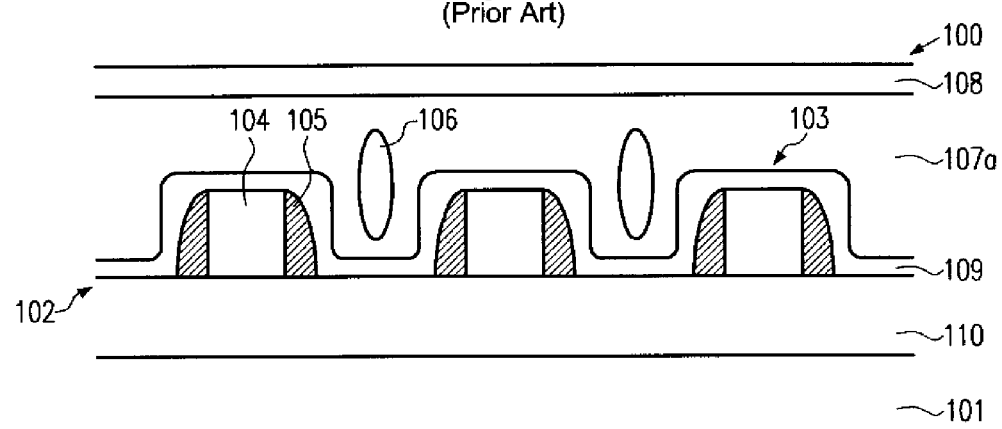
Figure 1C:
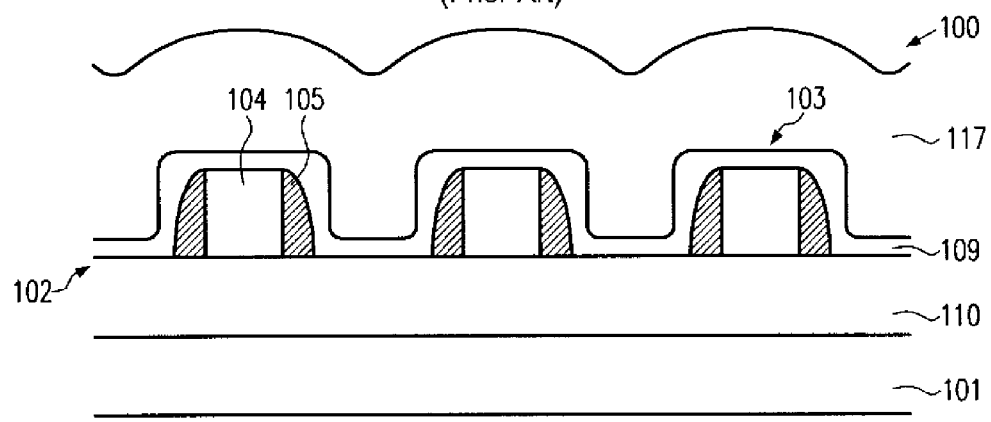
FIG. 1c schematically shows a conventional semiconductor device during the formation of the dielectric interlayer by means of a silicon dioxide deposition technique having superior gap filling capabilities compared to the plasma enhanced CVD.

After the formation of the silicon dioxide layer 207, a CMP process is performed, wherein well-established process recipes may be used since the characteristics of the layer 207 are the same as in the conventional case shown in FIGS. 1a and 1b. Thus, contrary to the conventional process flow as described with reference to FIG. 1c, laborious development and test procedures for the CMP and wafer handling process are not necessary, thereby saving on production costs.

FIG. 2b schematically shows the semiconductor device 200 after the CMP process, thereby producing a planarized silicon dioxide layer 207a. Moreover, an ARC layer 208 is formed on the layer 207a. As in the conventional case, the ARC layer 208 may be comprised of silicon oxynitride and may have optical characteristics and a layer thickness to comply with the subsequent photolithography. That is, an index of refraction, an extinction coefficient, and a layer thickness of the layer 208 are adapted to the exposure wavelength of the photolithography to reduce the back reflection into a resist layer to be formed on top of the layer 208.

Consequently, a dielectric interlayer 212 is obtained including the layers 209, 217, 207a and 208 through which respective contact openings (not shown) may be formed and subsequently filled with an appropriate conductive material, such as tungsten, tungsten silicide and the like. Thereafter, the first metallization layer (not shown) may be formed on top of the dielectric interlayer 212 by well-established techniques. Due to the fact that even for extremely scaled devices with distances 211 of approximately 200 nm or less, a void free deposition of silicon dioxide may be accomplished, while the film characteristics that substantially determine the specifics of the CMP process may be the same as in conventional plasma enhanced CVD techniques, a high overall deposition rate for the dielectric interlayer 212 and thus less cost of ownership may be achieved compared to conventional approaches involving the deposition of the bulk silicon dioxide by means of deposition techniques of improved gap filling capabilities.

With reference to FIG. 3, further illustrative embodiments of the present invention will be described. In FIG. 3, a semiconductor device 300 comprises a substrate 301, a device layer 302 including a semiconductor layer 310, and a structure 303 with closely spaced lines 304. The lines 304 may include spacer elements 305 and a distance 311 between adjacent lines 304 may be approximately 200 nm or less. A silicon dioxide layer 317 is formed over the structure 303 to encapsulate the structure 303, thereby filling at least a portion of the empty space between two adjacent lines 304. As previously noted, the silicon dioxide layer 317 may have substantially flow-like characteristics so that a layer thickness on top of the line 304, indicated as 304a, is significantly less than a layer thickness 304b within the spaces. The layer 317 may be formed, for instance by SACVD, and the deposition rate of this process may depend on the surface characteristics of the underlying materials. The SACVD process on the basis of TEOS and ozone may have a reduced deposition rate on silicon nitride, and hence, in some embodiments, it may be advantageous in view of enhanced deposition rates to deposit the SACVD TEOS silicon dioxide 317 directly over the device layer 302 to reduce the aspect ratios of the spaces between neighboring lines, as is also explained with reference to FIG. 2a.

Thereafter, an etch stop layer 309, for instance based on silicon nitride, may be formed, wherein the requirements with respect to conformality are relaxed compared to the layer 209 in FIGS. 2a and 2b, since the aspect ratio "seen" by the deposition of the etch stop layer 309 is less than in FIG. 2a. Due to the etch stop layer 309 on top of the layer 317, the layer 317 is passivated, thereby improving the stability of the layer 317, for instance with respect to water absorption and stress variations. Thereafter, the bulk silicon dioxide may be deposited by well-established plasma enhanced CVD techniques to form the layer 307 similarly as described with reference to FIG. 2a.

The further processing for the device 300 may be continued as is described with reference to FIGS. 2a and 2b, that is, the layer 307 may be planarized by CMP using well-established conventional process recipes and a corresponding ARC layer, such as the layer 208, may be formed on top of the planarized layer 307. Subsequently, a photolithography may be performed and anisotropic etch techniques may be used to form contacts (not shown) through the layers 307, 309, and 317. It should be noted that, due to the location of the etch stop layer 309 over the silicon dioxide layer 317, the anisotropic etch process firstly stops at the layer 309, which then has to be opened, and then the etch process has to be continued to form respective openings through the layer 317. During this etch process, the different layer thickness 304a, 304b may be acceptable, as the etch process may be highly selective to the underlying material so that a minute increase in material removal on top of the line 304 may not negatively affect the etch process. Due to the increased deposition rate in forming the layer 317 and due to the relaxed constraints with respect to conformality of the etch stop layer 309, the throughput may be further increased compared to conventional approaches.

As a result, the present invention provides an enhanced technique for forming a dielectric interlayer in which high rate deposition techniques are combined with deposition techniques of enhanced gap filling capabilities to extend well-established process methods to semiconductor devices of reduced critical dimensions. In particular, the bulk material of a silicon dioxide based dielectric interlayer may be deposited by well-established plasma enhanced CVD techniques, even for semiconductor devices of the 90 nm technology node and beyond, wherein well-established CMP recipes may also be used, thereby maintaining high production yield and reducing cost of ownership compared to conventional approaches using thermal CVD or high density plasma CVD techniques for forming the bulk of the silicon dioxide. Additionally, stress engineering may be facilitated, since layer intrinsic stress variations may be reduced and more flexibility in adjusting a desired type of stress immediately above the device layer may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first layer comprising a first dielectric material over a structure having lines and spaces, said first dielectric layer conformally covering said structure and said spaces having a first aspect ratio prior to forming said first dielectric layer;
    without forming or depositing an interposing spacer, layer, or partial layer therebetween, forming a second layer comprising a second dielectric material on the entirety of said first dielectric layer, said second layer partially filling said spaces, said partial filling of said spaces resulting in said spaces having a second aspect ratio less than said first aspect ratio; and
    forming a third layer comprising said second dielectric material above said second layer by a plasma enhanced chemical vapor deposition technique to enclose said structure.

2. The method of claim 1, wherein said spaces have a width of approximately 200 nm or less.

3. The method of claim 1, further comprising planarizing said third layer by chemical mechanical polishing.

4. The method of claim 3, further comprising forming an anti-reflective layer on said planarized third layer.

5. The method of claim 1, wherein said first dielectric material comprises silicon nitride and said second dielectric material comprises silicon dioxide.

6. The method of claim 1, wherein said second layer is deposited by a thermal chemical vapor deposition technique at sub-atmospheric pressure.

7. The method of claim 1, wherein said second layer is deposited by a high density plasma chemical vapor deposition technique.

8. A method of forming a dielectric interlayer between a device layer including closely spaced lines and a first metallization layer, wherein spaces between said closely spaced lines have a first aspect ratio, the method comprising:
    depositing an etch stop layer above said device layer;
    depositing a first layer of silicon dioxide above said etch stop layer and said device layer by one of a thermal CVD process based on TEOS and a high density plasma CVD process, wherein after depositing said first layer of silicon dioxide said spaces between said closely space lines have a second aspect ratio less than said first aspect ratio;
    depositing a second layer of silicon dioxide above said first layer by a plasma enhanced CVD process based on TEOS; and
    planarizing said second layer by CMP.

9. The method of claim 8, wherein a distance between said closely spaced lines is approximately 200 nm or less.

10. The method of claim 8, wherein said etch stop layer comprises silicon nitride.

11. The method of claim 10, wherein said etch stop layer is deposited as a conformal layer.

12. A method of forming a dielectric interlayer between a device layer including closely spaced lines and a first metallization layer, wherein spaces between said closely spaced lines have a first aspect ratio, the method comprising:
    depositing a first layer of silicon dioxide over said device layer by one of a thermal CVD process based on TEOS and a high density plasma CVD process, wherein after depositing said first layer of silicon dioxide over said device layer, said spaces between said closely space lines have a second aspect ratio less than said first aspect ratio;
    depositing an etch stop layer on said first layer;
    depositing a second layer of silicon dioxide above said etch stop layer by a plasma enhanced CVD process based on TEOS; and
    planarizing said second layer by CMP.

13. The method of claim 12, wherein said etch stop layer comprises silicon nitride.

14. The method of claim 12, further comprising forming an anti-reflective coating layer on said second layer.

15. A method, comprising:
    forming a device layer comprising a plurality of closely spaced gate electrode structures above a semiconductor substrate, wherein spaces between each of said plurality of closely spaced gate electrode structures comprise a first aspect ratio, said first aspect ratio comprising a width;
    depositing a conformal etch stop layer above said device layer comprising said plurality of closely spaced gate electrode structures;
    depositing a first layer of a dielectric material above said conformal etch stop layer by one of a chemical vapor deposition technique at sub-atmospheric pressure based on TEOS and a high density plasma chemical vapor deposition process, wherein after depositing said first layer of said dielectric material, said spaces between said plurality of closely space gate electrode structures comprise a second aspect ratio, said second aspect ratio being less than said first aspect ratio;
    depositing a second layer of said dielectric material above said first layer of said dielectric material by a plasma enhanced chemical vapor deposition process based on TEOS;
    planarizing said second layer of said dielectric; and
    forming a metallization layer above said planarized second layer of said dielectric material.

16. The method of claim 15, wherein said width is approximately 200 nm or less.

17. The method of claim 15, wherein said width is approximately 180 nm or less.

18. The method of claim 15, wherein at least one of said plurality of closely spaced gate electrode structures comprises a first sidewall spacer structure and a second sidewall spacer structure disposed on opposite sides thereof.

19. The method of claim 15, wherein said conformal etch stop comprises silicon nitride.

20. The method of claim 15, wherein said dielectric material comprises silicon dioxide.

21. The method of claim 15, wherein a passivation layer comprising silicon nitride is formed on said first layer of said dielectric material prior to forming said second layer of said dielectric material.

22. The method of claim 15, wherein planarizing said second layer of said dielectric material comprises performing a chemical mechanical polishing process.

23. A method, comprising:
    forming a device layer comprising a plurality of closely spaced gate electrode structures above a semiconductor substrate, wherein spaces between each of said plurality of closely spaced gate electrode structures comprise a first aspect ratio, said first aspect ratio comprising a width;
    depositing a first layer of a dielectric material above said device layer comprising said plurality of closely spaced gate electrode structures by one of a chemical vapor deposition technique at sub-atmospheric pressure based on TEOS and a high density plasma chemical vapor deposition process, wherein after depositing said first layer of said dielectric material, said spaces between said plurality of closely space gate electrode structures comprise a second aspect ratio, said second aspect ratio being less than said first aspect ratio;
    depositing an etch stop layer above said first layer of a dielectric material;
    depositing a second layer of said dielectric material above said etch stop layer by a plasma enhanced chemical vapor deposition process based on TEOS;
    planarizing said second layer of said dielectric material; and
    forming a metallization layer above said planarized second layer of said dielectric material.

24. The method of claim 23, wherein said width is approximately 200 nm or less.

25. The method of claim 23, wherein said width is approximately 180 nm or less.

26. The method of claim 23, wherein at least one of said plurality of closely spaced gate electrode structures comprises a first sidewall spacer structure and a second sidewall spacer structure disposed on opposite sides thereof.

27. The method of claim 23, wherein said dielectric material comprises silicon dioxide.

28. The method of claim 23, wherein said etch stop layer comprises silicon nitride.

29. The method of claim 23, wherein planarizing said second layer of said dielectric material comprises performing a chemical mechanical polishing process.

* * * * *